United States Patent
Vega et al.

(10) Patent No.: US 12,382,621 B2
(45) Date of Patent: Aug. 5, 2025

(54) DECOUPLING CAPACITOR INSIDE GATE CUT TRENCH

(71) Applicant: INTERNATIONAL BUSINESS MACHINES CORPORATION, Armonk, NY (US)

(72) Inventors: Reinaldo Vega, Mahopac, NY (US); Takashi Ando, Eastchester, NY (US); Praneet Adusumilli, Somerset, NJ (US); David Wolpert, Poughkeepsie, NY (US); Cheng Chi, Jersey City, NJ (US)

(73) Assignee: International Business Machines Corporation, Armonk, NY (US)

( * ) Notice: Subject to any disclaimer, the term of this patent is extended or adjusted under 35 U.S.C. 154(b) by 377 days.

(21) Appl. No.: 17/808,178

(22) Filed: Jun. 22, 2022

(65) Prior Publication Data
US 2023/0422461 A1 Dec. 28, 2023

(51) Int. Cl.
*H10B 10/00* (2023.01)
*H01L 23/528* (2006.01)
*H10D 1/68* (2025.01)

(52) U.S. Cl.
CPC ......... *H10B 10/12* (2023.02); *H01L 23/5286* (2013.01); *H10D 1/68* (2025.01)

(58) Field of Classification Search
CPC ..... H10B 10/12; H01L 23/5286; H01L 28/40; H10D 1/68
See application file for complete search history.

(56) References Cited

U.S. PATENT DOCUMENTS

| | | | |
|---|---|---|---|
| 6,888,714 B2 | 5/2005 | Shaw | |
| 7,193,262 B2 | 3/2007 | Ho | |
| 9,716,036 B2 | 7/2017 | Chang | |
| 10,128,327 B2 | 11/2018 | Zhang | |
| 10,566,413 B2 | 2/2020 | Lu | |
| 12,057,387 B2 | 8/2024 | Vega et al. | |
| 2021/0358850 A1* | 11/2021 | Chen | H01L 27/0629 |
| 2021/0367033 A1* | 11/2021 | Wang | H01L 21/76229 |
| 2022/0344461 A1* | 10/2022 | Jung | H01L 29/66439 |

OTHER PUBLICATIONS

Hoffmann, et al., "Unveiling the double-well energy landscape in a ferroelectric layer." Published Jan. 24, 2019 by Springer. 12 pages. In Nature, vol. 565, pp. 464-475. https://doi.org/10.1038/s41586-018-0854-z.

(Continued)

*Primary Examiner* — Nelson Garces
(74) *Attorney, Agent, or Firm* — Matthew Zehrer

(57) ABSTRACT

An approach to forming a semiconductor device where the semiconductor device includes a first power rail that is connected to a decoupling capacitor by way of a first gate. The decoupling capacitor is also connected to a second gate. As such, the decoupling capacitor separates the first gate from the second gate. The decoupling capacitor may include a dielectric liner within a gate cut trench and a ferroelectric material over the dielectric liner. A second power rail may be connected to the decoupling capacitor by way of the second gate. The first gate and the second gate may be inline with respect thereto.

19 Claims, 9 Drawing Sheets

(56) References Cited

OTHER PUBLICATIONS

Krivokapic, et al., "14nm Ferroelectric FinFET technology with steep subthreshold slope for ultra low power applications." Published in 2017 by IEEE. 4 pages. In 2017 IEEE International Electron Devices Meeting (IEDM), pp. 15.1.1-15.1.4, doi:10.1109/IEDM.2017.8268393.
Lee, et al., "Bi-directional Sub-60mV/dec, Hysteresis-Free, Reducing Onset Voltage and High Speed Response of Ferroelectric-AntiFerroelectric Hf0.25Zr0.75O2 Negative Capacitance FETs." Published in 2019 by IEEE. 4 pages. In 2019 IEEE International Electron Devices Meeting (IEDM), pp. 23.6.1-23.6.4, doi: 10.1109/IEDM19573.2019.8993581.
Li, et al., "Sub-60mV-swing negative-capacitance FinFET without hysteresis." Published in 2015 by IEEE. 4 pages. In 2015 IEEE International Electron Devices Meeting (IEDM), pp. 22.6.1-22.6.4, doi: 10.1109/IEDM.2015.7409760.
Liu, et al., "Negative Capacitance CMOS Field-Effect Transistors with Non-Hysteretic Steep Sub-60mV/dec Swing and Defect-Passivated Multidomain Switching." Published in 2019 by IEEE. 2 pages. In 2019 Symposium on VLSI Technology, pp. T224-T225, doi:10.23919/VLSIT.2019.8776482.
Yadav, et al., "Spatially resolved steady-state negative capacitance," Published Jan. 24, 2019 by Springer. In Nature, 565, pp. 468-483. https://doi.org/10.1038/s41586-018-0855-y.

* cited by examiner

DECOUPLING CAPACITOR INSIDE GATE CUT TRENCH

BACKGROUND

The present invention relates generally to the field of semiconductor memory device technology and more particularly to forming a decoupling capacitor inside a gate cut trench in a semiconductor circuit.

Semiconductor device manufacturing and design are continually packaging more circuits into semiconductor chips as line widths and spacing between device elements shrink, while still striving for increasing semiconductor device performance. Traditionally, transistors are formed on the semiconductor substrate and are connected together by layers of interconnects and power structures formed above the transistors. Conventional power rails, commonly used with memory devices such as static-random access memory (SRAM), typically reside in the interconnect layers above the transistors. Conventional power rails in interconnect layers consume a significant amount of area and to meet semiconductor performance requirements, typically use large power supply guardbands to address power rail noise. To reduce power rail noise and improve semiconductor device performance, decoupling capacitors, such as metal-insulator-metal capacitors (MIMCAPs) formed in the interconnect layers, or deep trench capacitors formed in an insulating layer of a silicon-on-insulator semiconductor substrates, are used to reduce power rail noise and increase semiconductor device performance.

SUMMARY

An embodiment of the present invention is directed to a semiconductor structure. The semiconductor structure includes a first power rail and a second power rail. The semiconductor structure further includes a first via contact that connects the first power rail to a portion of a decoupling capacitor through a first gate within a n-active region. The semiconductor structure further includes a second via contact that connects the second power rail to a portion of the decoupling capacitor though a second gate within a p-active region. The decoupling capacitor separates the first gate from the second gate.

An embodiment of the present invention is directed to another semiconductor structure. The semiconductor structure includes a power rail. The semiconductor structure further includes a via contact that connects the power rail to a portion of a decoupling capacitor through a first gate. The semiconductor structure further includes a second gate. The decoupling capacitor separates the first gate from the second gate.

An embodiment of the present invention is directed to a method of fabricating a semiconductor structure. The method includes performing one or more first etch processes to remove a portion of an interlayer dielectric to form a first gate cut trench that exposes a first end of a gate structure. The method further includes depositing first dielectric material filling the first gate trench. The method further includes subsequently performing one or more second etch processes to remove a portion of the gate structure to form a second gate cut trench that separates the gate structure into a first gate and a second gate. The method further includes depositing a second dielectric material lining the second gate cut trench. The method further includes depositing a layer of a ferroelectric material over the second dielectric material.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Figure 1A:
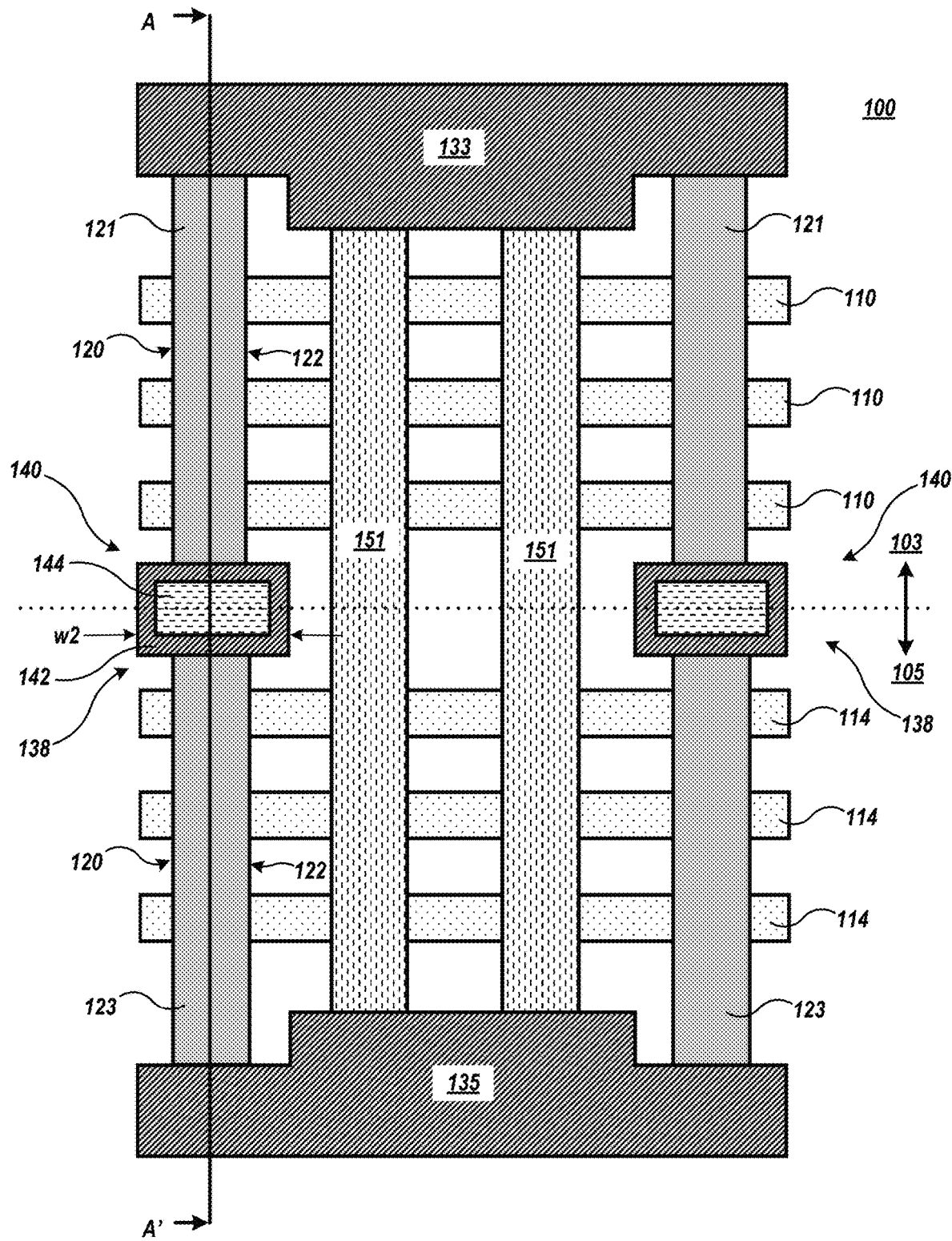
FIG. 1A is a top-down view of a layout of a semiconductor circuit, in accordance with an embodiment of the present invention.

Embodiments of the present invention recognize that power rails typically reside in the interconnect layers above the transistors. Embodiments of the present invention recognize that power rail noise is detrimental to system performance. Power rail noise increases the instantaneous peak drain voltage supply or increases Vdd throughout a noise cycle. The increase in power rail noise drives an increase in Vdd guardband requirements which, in turn, reduces the nominal voltage. Embodiments of the present invention recognize that the larger the guardband, the lower the nominal operating voltage of the semiconductor circuit and therefore the lower the performance for a given semiconductor circuit design. Embodiments of the present invention recognize that reducing power rail noise allows an increase to the nominal operating voltage in the semiconductor circuit design and therefore, provides more performance from the semiconductor circuit design.

Embodiments of the present invention recognize that decoupling capacitors reduce power rail noise. In some cases, deep trench capacitors or MIMCAPs, in the back end of the line (BEOL) are used as decoupling capacitors to reduce noise. Embodiments of the present invention recognize that the metal-insulator-metal capacitors (MIMCAPs) formed in the back end of the line (BEOL) semiconductor processes provide lower capacitor density and a limited frequency response due to the resistive network in the BEOL wiring. Embodiments of the present invention recognize that placing a decoupling capacitor with high capacitance density as close as possible to the power rail provides improvements in semiconductor chip and system performance.

Embodiments of the present invention provide a method of forming decoupling capacitors in gate cut trenches that separate an n-type gate from a p-type gate that are both tied to a respective power rail. Embodiments of the present invention include a method of forming the decoupling capacitors in a top portion of the semiconductor substrate by performing one or more etches that remove a portion of a gate, a portion of the shallow trench isolation (STI) under the removed portion of the gate, and a top portion of the semiconductor substrate. While gate cut trenches are typically etched through the ends of the gates and extend downward to a top surface of the STI, embodiments of the present invention etch the gate cut trench deeper so that the gate cut trench extends into a top portion of the semiconductor substrate. Extending the gate cut trench into the semiconductor substrate allows a deposition of the decoupling capacitor materials in the gate cut trench in the semiconductor substrate. The decoupling capacitors, formed in the deep gate cut trench in the semiconductor substrate amplify coupling capacitance between the n-type gate and the p-type gate that are both tied to a respective power rail. For example, VDD to VSS decoupling capacitance is increased.

Embodiments of the present invention provide decoupling capacitors in the semiconductor substrate using a deeper gate cut trench that reduces power rail noise, providing closer proximity to the power rail than MIMCAPs or traditional deep trench capacitors. Placing the decoupling capacitors closer to the power rail reduces resistor-capacitor (RC) circuit delay between the decoupling capacitor and the power rail and improves frequency response and/or high frequency noise rejection.

Embodiments of the present invention provide several different material combinations and semiconductor structures for the decoupling capacitors in the gate cut trench to allow design trade-offs in processes and materials resulting in different levels of performance of the decoupling capacitors. Embodiments of the present invention provide decoupling capacitors in the semiconductor substrate with different stack combinations of dielectric materials, ferroelectric materials, and metals, that result in different electrical performance of the decoupling capacitors. Embodiments of the present invention provide a dielectric material and ferroelectric material forming the decoupling capacitor. Embodiments of the present invention also provide a metal material, high k dielectric material, and ferroelectric material in a metal-ferroelectric-insulator-metal (MFIM) stack forming another decoupling capacitor. Embodiments of the present invention provide a method of forming larger decoupling capacitors in the semiconductor substrate to improve the capacitance density of the decoupling capacitor by increasing the depth of the gate cut trench in the semiconductor substrate.

Figure 13:
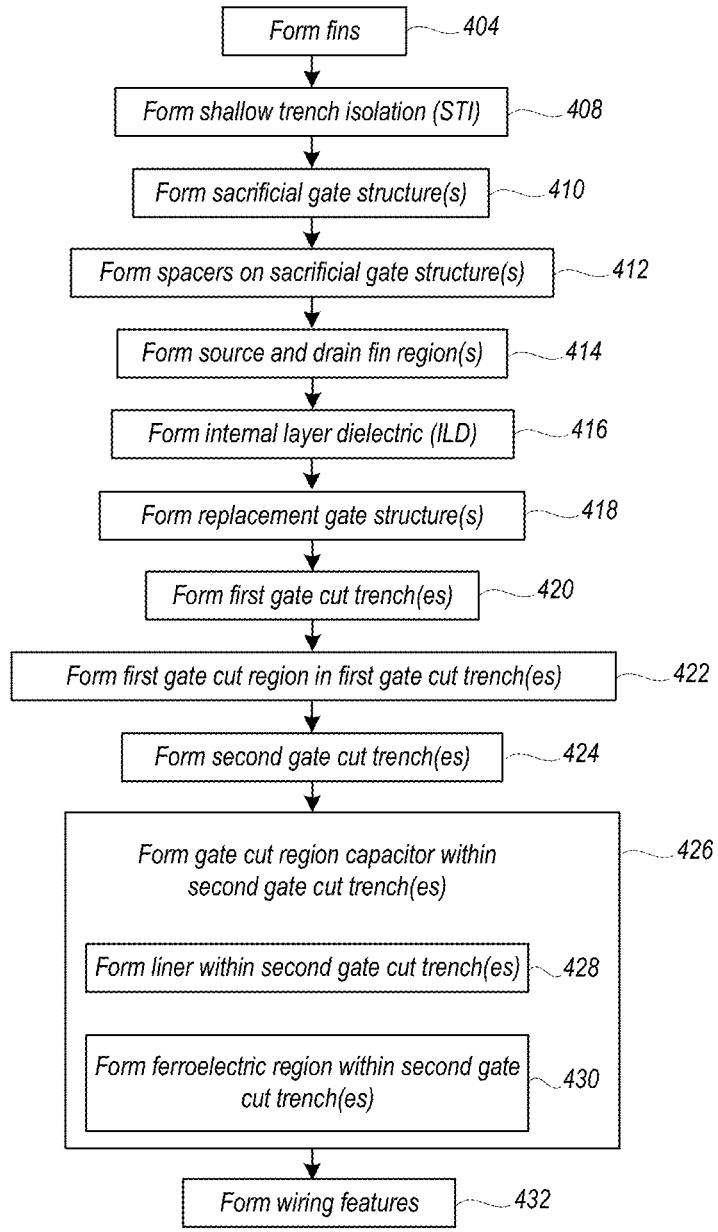
FIG. 13 and FIG. 14 depict a semiconductor device fabrication method, in accordance with embodiments of the present invention.
Figure 14:
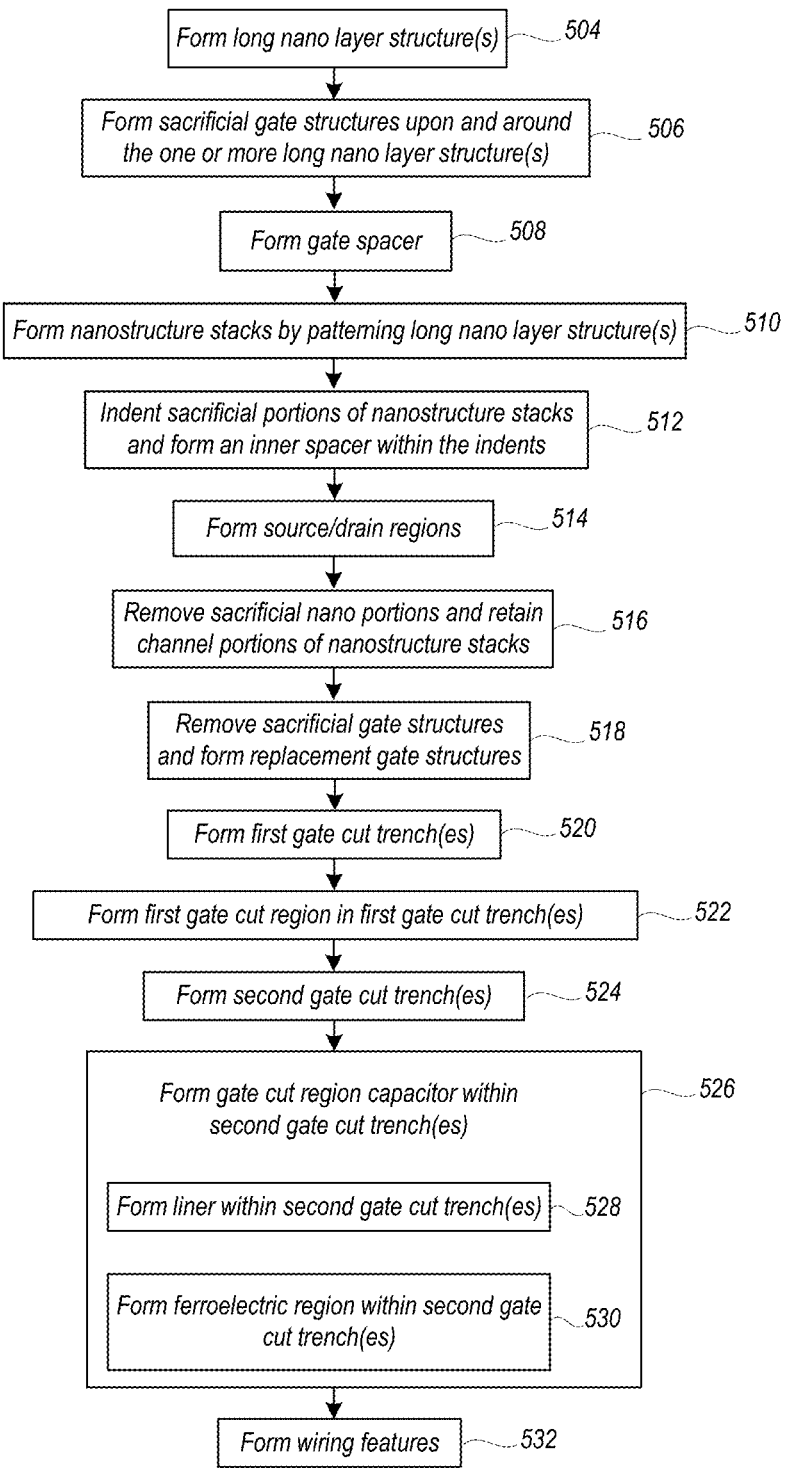

Embodiments of the present invention provide methods 400, 500, exemplarily depicted in FIG. 13 and FIG. 14, respectively, of forming a semiconductor structure or device that includes the decoupling capacitor in the semiconductor substrate. The methods may include increasing the etch depth of the gate cut trench using one or more etch processes and a single gate cut etch mask. The methods may include performing a standard gate cut trench etch, for example, to the top of the STI, and then, deepening the standard gate cut trench by etching through the STI and continuing the etch into the semiconductor substrate. One or more etch processes are used to increase the depth of the etched gate cut trench to extend the gate cut trench into the semiconductor substrate. The methods may include etching the gate cut trench below and parallel to where the power rails will be formed in later steps.

The methods include forming a layer of a dielectric material on the semiconductor substrate surface in the deeper gate cut trench between the p-type gate and the n-type gate. After forming the layer of the dielectric material, a deposition of a ferroelectric material in the gate cut trench occurs. The methods may further include connecting the p-type gate to one power rail and the n-type gate to a second power rail.

FIGS. 1A-1B and 2-12 illustrate exemplary semiconductor structures that include a decoupling capacitor between the p-type gate that is connected to one power rail and the n-type gate that is connected to a second power rail. In embodiments of the present invention, the semiconductor structures depicted in FIGS. 1A-1B and 2-12 depict a ferroelectric and insulator within the deeper gate cut trench. The n-type gate (e.g., metal replacement gate, semiconductor sacrificial gate, or the like) and the p-type gate (e.g., metal replacement gate, semiconductor sacrificial gate, or the like) may be conductive structures that at least partially form a metal-ferroelectric-insulator-semiconductor (MFIS) capacitor, a metal-ferroelectric-insulator-metal (MFIM) capacitor, or the like.

Figure 1B:
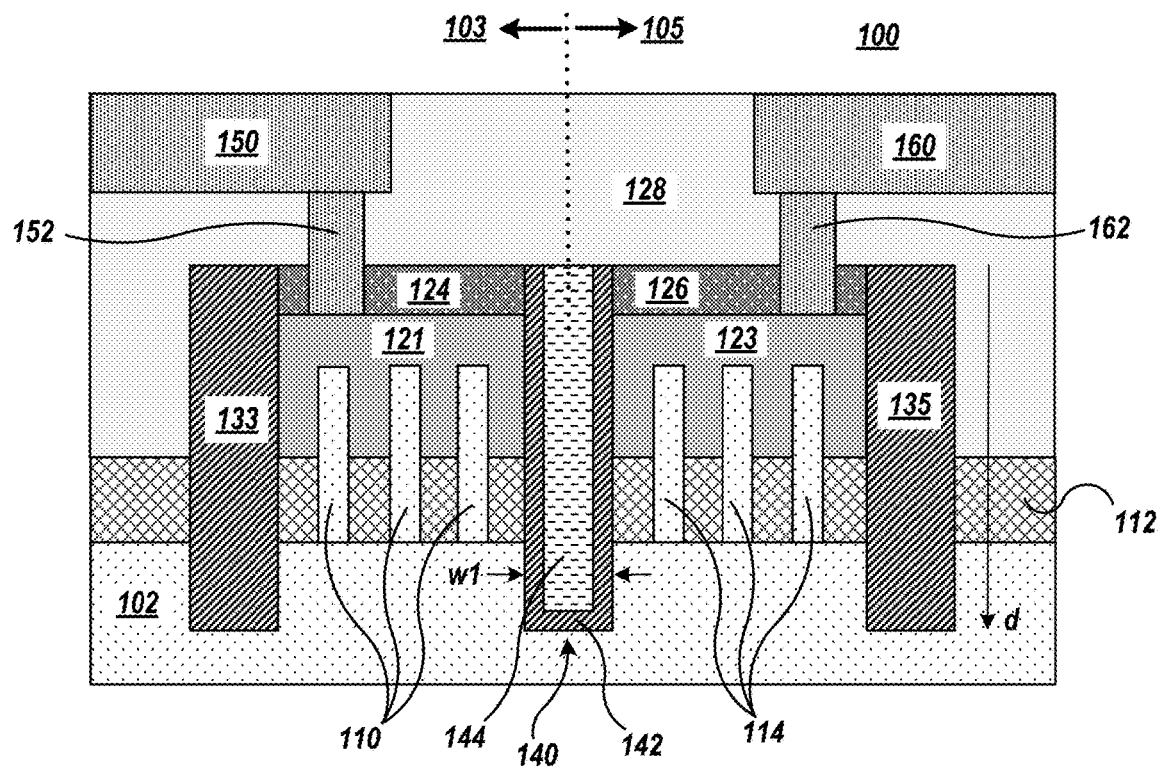
FIG. 1B is a cross-sectional view of a semiconductor structure through section A-A' of the layout of a semiconductor circuit of FIG. 1A, in accordance with an embodiment of the present invention.
Figure 12:
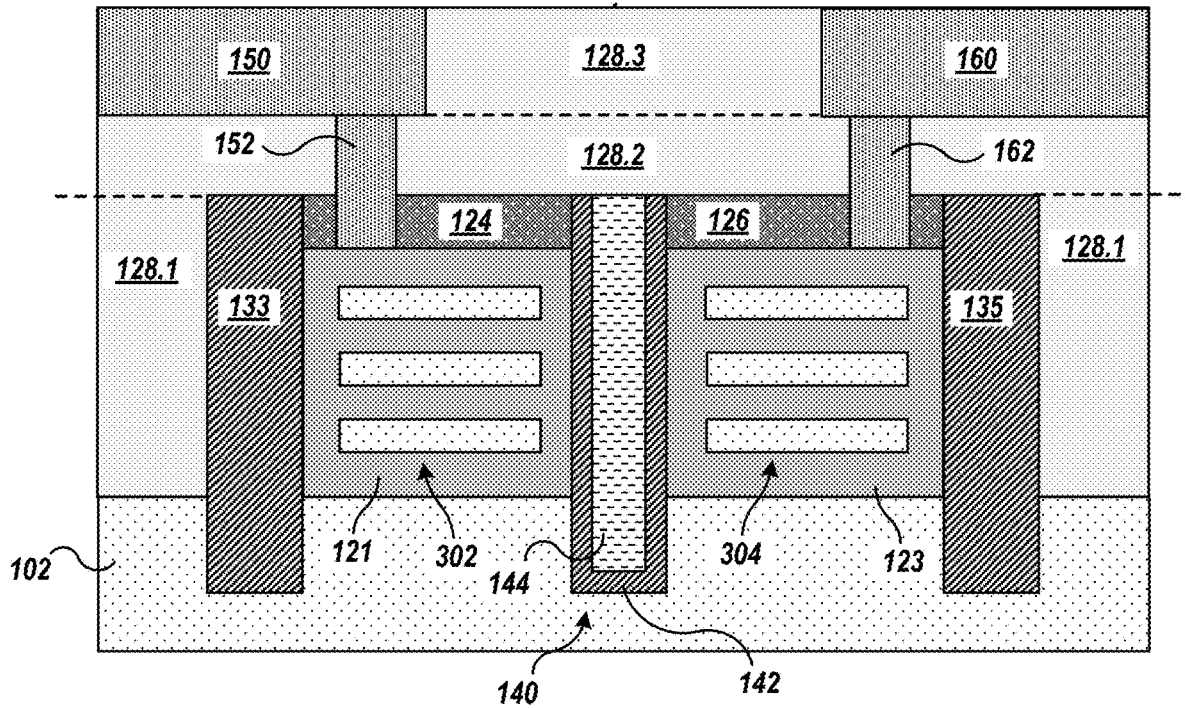

Referring to FIG. 1A and FIG. 1B, where FIG. 1A is a top-down view of semiconductor structure 100 of a semiconductor circuit and FIG. 1B is a cross-sectional view of the semiconductor structure 100 through section A-A' of the semiconductor circuit of FIG. 1A. The semiconductor structure 100 includes an active region 103, an active region 105, power rail 150, and power rail 160, in accordance with an embodiment of the present invention. While the semiconductor circuit may relate to an inverter as a logic cell or a device circuit using fins in the active region 103 and active region 105, the semiconductor circuit is not limited thereto. For example, as depicted in FIG. 12 the semiconductor circuit may alternatively include nanostructures or another transistor device in the active region 103 and active region 105.

The semiconductor circuit could represent a logic cell or a logic gate, such as, a NOT-AND (NAND) gate or a NOT-OR (NOR) gate. A NAND gate is a logic gate which produces an output which is false only if all its inputs are true. A NOR gate as a logic gate or device circuit produces a positive output when both inputs are negative. In other embodiments, another type of device circuit can be formed using another type of semiconductor structure, such as, a planar structure (e.g., a planar field effect transistor rather than a fin field effect transistor), a nanosheet structure (e.g., depicted in FIG. 12).

While FIG. 1B depicts two power rails, in other embodiments more than two power rails are present in the semiconductor circuit or logic cell of the semiconductor circuit.

Semiconductor structure 100 further includes n-type fins 110, one or more n-type gates 121, p-type fins 114, one or more p-type gates 123, and a decoupling capacitor 140 within gate cut region 138 that separates the n-type gate 121 from the p-type gate 123. Semiconductor structure 100 may further include gate cap 124, gate cap 126, inter layer dielectric (ILD) 128, shallow trench isolation (STI) 112, substrate 102, one or more auxiliary gates 151, a gate cut region 133, a gate cut region 135, via contact 152, and via contact 162. The one or more p-type gates may be a sacrificial gate or gate structure, a replacement gate or gate structure, or the like generally located in active region 103. The one or more n-type gates may be a sacrificial gate or gate structure, a replacement gate or gate structure generally located in active region 105.

As depicted in FIG. 1B, via contact 152 connects power rail 150 to n-type gate 121 and via contact 162 connects to power rail 160 and p-type gate 123. In this way, each of power rails 150 and 160 directly connects by one via contact 152, 162, respectively to decoupling capacitor 140 in the gate cut trench between n-type gate 121 and p-type gate 123.

Power rails 150 and 160 may reside in at least a first metal layer. However, power rails 150 and 160 can also reside in one or more metal layers above M1 (not depicted). In various embodiments of the present invention, power rails 150 and 160 are considered to include via contact 152, via contact 162, that are below and electrically connected to power rails 150 and 160. In various embodiments, power rail 150 is a VSS or ground power rail. In various embodiments, power rail 160 is a direct current power supply (VDD) power rail that is associated with an n-well. An n-well may be a portion of the semiconductor substrate 102 that is doped with an n-type material (e.g., can be a part of a p-type transistor with active region 105). In other examples, the ground and VDD functions of power rails 150 and 160 may be reversed (e.g., power rail 150 is a VDD power rail).

In various embodiments, gate cut regions 133, 135 define locations where a portion of n-type gate(s), p-type gate(s), and/or auxiliary gates 151, respectively are removed. An associated gate cut trench can be used to define a cut or an etch perpendicular to a direction of n-type gate(s), p-type gate(s), and/or auxiliary gates 151. In this way, when an edge or end of n-type gate(s), p-type gate(s), and/or auxiliary gates 151 is formed by an etch of thereof, the end or edge provides improved electrical performance for n-type gate(s), p-type gate(s), and/or auxiliary gates 151 as compared to a gate that is not formed using a gate cut trench. Gate cut regions 133, 135 in association with auxiliary gate(s) 150 may not be present but, are depicted as a possible location with respect thereto. In FIG. 1B, gate cut region 133 is located with n-active region 103 and under power rail 150 and gate cut region 135 is located with active region 105 and under power rail 160. In FIG. 1A, gate cut region 133 may be parallel gate cut region 133. Further, in FIG. 1B, power rails 150 and 160 may be parallel to gate cut regions 133 and 135, into an out of the page, respectively. ILD material 128 may contact on one side and top surface of gate cut regions 133, 135. In other embodiments, gate cut region 133 may separate two neighboring n-type gates 121 and gate cut region 135 may separate two neighboring p-type gates 123.

Gate cut regions 133, 135, extend under each of power rails 150 and 160, extend down from a top of n-type gate 121, p-type gate 123, respectively, through STI 112, into a top portion of semiconductor substrate 102. Gate cut regions 133, 135 may be formed of dielectric fill, or the like.

In various embodiments, gate cut region(s) 138 define locations of a gate cut trench that remove a portion of n-type gate(s) and p-type gate(s), thereby separating the n-type gate(s) and p-type gate(s) and may further define the locations in which decoupling capacitor 140 is formed within said trench. The associated gate cut trench can be used to define a cut or an etch perpendicular to a direction of n-type gate(s) and p-type gate(s). In this way, when an edge or end of n-type gate(s), and p-type gate(s) is formed by an etch of thereof, the end or edge provides improved electrical performance for n-type gate(s) and p-type gate(s), as compared to a gate that is not formed using a gate cut trench. In FIG. 1A, gate cut region 138 may be wider than the n-type gate(s) and the p-type gate(s).

While depicted as semiconductor structure 100 for an inverter, in other embodiments, the decoupling capacitor 140 between the n-type gate 121 within n-active region 103 and the p-type gate 123 within active region 105 are associated with another type of circuit device, such as a NAND gate, NOR gate, or a buffer logic gate, but are not limited to these types of semiconductor device circuits or logic cells.

Gate cut region 138 extends down from a top of n-type gate 121, p-type gate 123, respectively, through STI 112, into a top portion of semiconductor substrate 102. Gate cut regions 138 may be filled with the decoupling capacitor 140. Decoupling capacitor 140 may include a dielectric layer 142 and a ferroelectric layer 144. Ferroelectric layer 144 and dielectric layer 142 form a decoupling capacitor in the gate cut trench of gate cut region 138. The decoupling capacitor 140 extend into semiconductor substrate 102 to at least some predetermined depth. ILD material 128 may contact top surface of decoupling capacitor 140.

Fins 110 can be in n-active active region 103 and fins 114 can be in active region 105. STI 112 is above portions of semiconductor substrate 102. ILD 128 is over n-type gate(s) and p-type gate(s), over auxiliary gates 151, over gate spacers (not shown), over a portion of STI 112, over decoupling capacitor 140, surrounding via contacts 152, 162, and power rails 150 and 160. The decoupling capacitor 140 may have the depth, d, into semiconductor substrate 102 a first width, w1, and a second width, w2.

Dielectric layer 142 can be over a surface of semiconductor substrate 102 in the gate cut trench associated with gate cut region 138. Ferroelectric layer 144 can be over dielectric layer 142 and inside a portion of STI 112 in the gate cut trench associated with gate cut region 138. Decoupling capacitor 140 may abut a respective end of n-type gate 121 and p-type gate 123. The decoupling capacitors 140 may be formed in gate cut trench associated with gate cut region 138 etched with width, w2, into n-type gate 121 and p-type gate 123, into at least a portion of or through gate spacers, and optionally into a portion of ILD 128 and etched with width, w1, separating n-type gate 121 and p-type gate 123, down into semiconductor substrate 102 and depth, d, into semiconductor substrate 102. In some embodiments, semiconductor substrate 102 includes n-well in active region 105, p-well in n-active region 103.

Gate cut trench associated with gate cut regions 133, 135 extends from a top surface of n-type gate 121 and p-type gate 123 to a depth, d, in semiconductor substrate 102. The depth d of gate cut regions 133, 135 and the depth d of the decoupling capacitors 140 may be the same or substantially the same. The depth, d, of gate cut trench 138 changes the capacitance of the decoupling capacitors 140 (e.g., deeper etched gate cut trenches with a greater depth, d, can provide more capacitance). Further, the width, w1, and width, w2, of gate cut trench 138 changes the capacitance of the decoupling capacitors 140 (e.g., the larger w1 and w2 can provide more capacitance). Further, capacitance may be increased with an increasingly high permittivity dielectric material of dielectric layer 142 and small separation between the ferroelectric layer 144 and the n-type gate 121 and p-type gate 123 (e.g., a thin dielectric layer 142), respectively.

Dielectric layer 142 is inside gate cut trench associated with gate cut region 138. Dielectric layer 142 is on the surface of the portions of semiconductor substrate 102, is on the surface of portions of the STI 112, is on the end surfaces of n-type gate 121 and p-type gate 123, and upon surfaces of ILD 128 inside the applicable gate cut trench. The dielectric fill material of gate cut region 133, 135 is on the surface of the portions of semiconductor substrate 102, is on the surface of portions of the STI 112, is on the end surfaces of n-type gate 121 and p-type gate 123, respectively, and upon surfaces of ILD 128 inside the applicable gate cut trench. In various embodiments, dielectric layer 142 and the dielectric fill material may be silicon dioxide, or the like. In other embodiments, dielectric layer 142 and the dielectric fill material is a dielectric material commonly used in gate stacks (e.g., silicon dioxide ($SiO_2$), or a composite stack of hafnium dioxide ($HfO_2$) and a silicon oxide (SiOx), or an aluminum oxide ($Al_2O_5$).

The selection of the materials for ferroelectric layer 144, and a dielectric material, such as dielectric layer 142, at least in part, determines the amount of capacitance or capacitance density provided by the decoupling capacitors 140 formed by ferroelectric layer 144 and dielectric layer 142. In various embodiments, ferroelectric layer 144 may be a hafnium zirconium oxide (HZO) layer. In other embodiments, ferroelectric layer 144 may be formed of one of lead zirconium titanate (PZT), silicon-doped hafnium oxide (Si:HfO$_2$), or barium titanite. However, ferroelectric layer 144 is not limited to these materials and may another suitable ferroelectric material.

In various embodiments, the selection of a material for ferroelectric layer 144 and dielectric layer 142, and the depth, d, and widths, w1 and/or w2, of gate cut trench associated with gate cut region 138, each impacts the capacitance of the decoupling capacitor 140 therewithin. The depth, d, of this gate cut trench during the etch of gates n-type gate 121 and p-type gate 123, STI 112, ILD 128, and semiconductor substrate 102 can affect the capacitance provided by ferroelectric layer 144 with dielectric layer 142. In various embodiments, increasing the depth, d, of this gate cut trench into semiconductor substrate 102 increases the amount of capacitance generated by decoupling capacitors 140 formed therein (e.g., when each are composed of the same materials for ferroelectric layer 144 and dielectric layer 142).

In various embodiments, semiconductor substrate 102 includes an n-well in a portion within active region 103 of semiconductor substrate 102. Semiconductor substrate 102 can be composed of a silicon substrate, a group IV semiconductor material, a group III-V semiconductor material, a group II-VI semiconductor material, or other semiconductor material used in semiconductor circuits. In various embodiments, substrate 102 is a wafer or a portion of a wafer. In some embodiments, semiconductor substrate 102 includes one or more of doped regions, undoped regions, stressed regions, or defect rich regions. The n-well portion of semiconductor substrate 102 that is doped with a n-type material using semiconductor doping processes. In some embodiments, a portion of semiconductor substrate 102 may also include a p-well within active region 105.

Fins 110, 114 may connect to one or more power rails or other wiring lines through one or more source/drain contact(s) (not shown), respectively. In some embodiments, n-active region 103 is a portion of an NFET. For example, as depicted, n-type gate 121 is connected to power rail 150 by via contacts 152 and connected on three sides to each of the fins 110, which may serve as the source and drain of the NFET. Similarly, active region 105 is a portion of a PFET. For example, as depicted, p-type gate 123 is connected to power rail 160 by via contact 162 and connected on three sides to each of the fins 114, which may serve as the source and drain of the PFET.

For clarity, as depicted in FIG. 1A, the side surfaces 120, 122 of n-type gate 121 and p-type gate 123 may be inset with respect to the decoupling capacitor 140. For example, the width w2 of decoupling capacitor 140 may be greater than the dimension between the side surfaces 120, 122 of both n-type gate 121 and p-type gate 123. The relatively larger width w2 of decoupling capacitor 140, relative to n-type gate 121 and p-type gate 123, may result from dimensional and/or capacitance implementation requirement(s) of the decoupling capacitor 140.

FIGS. 2-12 depict fabrication stages of forming a semiconductor device of circuit depicted in layout of FIG. 1A. Specifically, the method discussed with respect to FIGS. 2-12 relates to the semiconductor structure 100 depicted in FIG. 1B and to the semiconductor structure 300 depicted in FIG. 12, where power rails 150 and 160 electrically connect to the decoupling capacitor 140 formed by ferroelectric layer 144 and dielectric layer 142 in gate cut trench 138 that separates a n-type gate 121 from p-type gate 123.

For purposes of the description hereinafter, the terms "upper," "lower," "right," "left," "vertical," "horizontal," "top," "bottom," and derivatives thereof relate to the described structures and methods, as oriented in the drawing Figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact," or the like, means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched, and the second element can act as an etch stop.

The terms "about," "substantially," "approximately," and variations thereof, are intended to include the degree of error associated with measurement of the quantity based upon the equipment available at the time of filing the application. For example, substantial coplanarity between various materials can include an appropriate manufacturing tolerance of ±8%, ±5%, or ±2% difference between the coplanar materials.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. Various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies that are more specifically relevant to aspects of the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Semiconductor devices can be formed in the active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate. The gate and the body are spaced apart by a gate dielectric layer. The channel connects the source and the drain, and electrical current flows through the channel from the source to the drain. The electrical current flow is induced in the channel region by a voltage applied at the gate.

Figure 2:
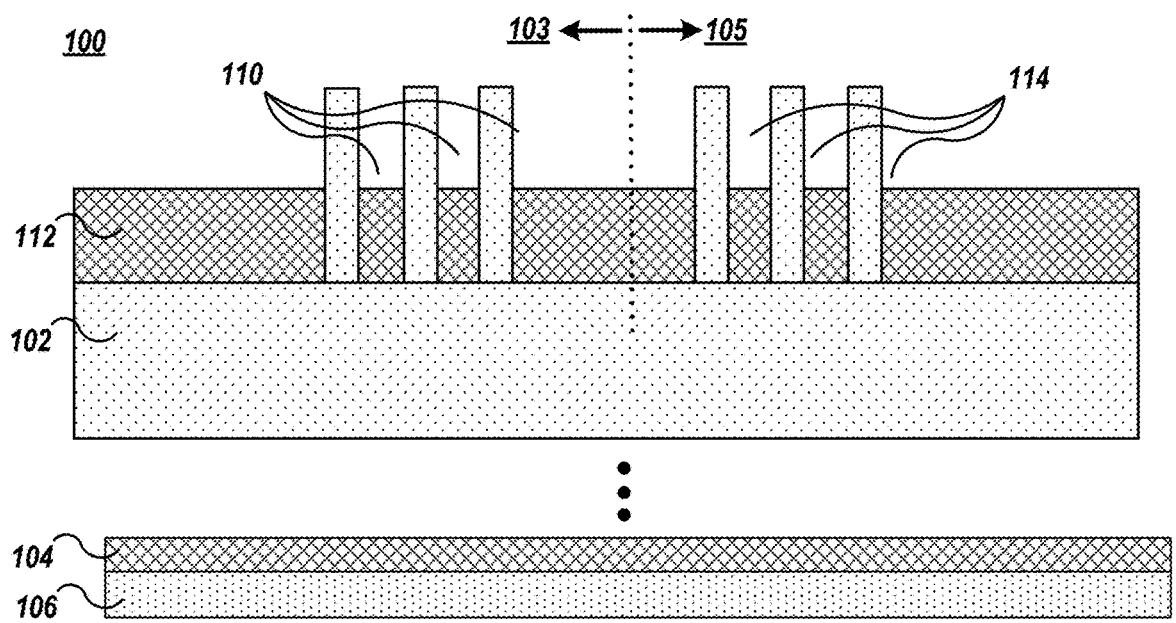
FIG. 2 though FIG. 12 are cross-sectional fabrication views of a semiconductor structure through section A-A' of the layout of the semiconductor circuit of FIG. 1A, in accordance with embodiments of the present invention.

FIG. 2 depicts a cross-sectional view of semiconductor structure 100 shown after fabrication operations, in accordance with one or more embodiments. After these fabrication operations, depicted in FIG. 13 as blocks 404, 406, and/or the like, semiconductor device 100 may include a n-active region 103, active region 105, a substrate 102, one or more fins 110 within the n-active region 103, one or more fins 114 within active region 105, STI layer 112 upon the substrate 102 and between the one or more fins 110 and between the one or more fins 114.

Figure 9:
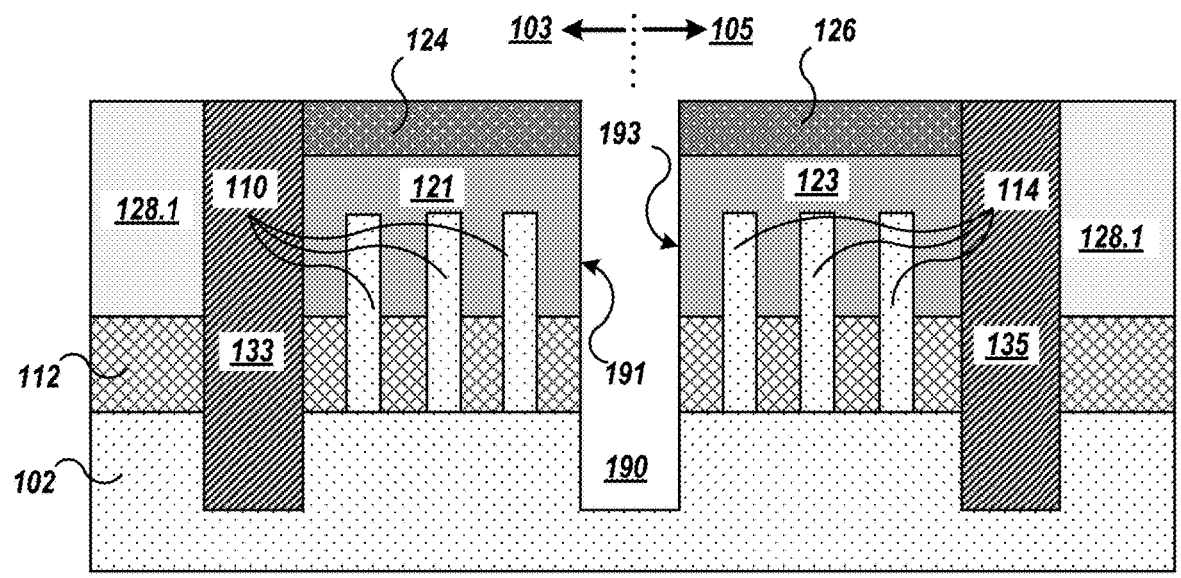

N-active region 103 may include one or more NFETs and active region 105 may include one or more PFETs. As such, the transistors within n-active region 103 may be of a first dopant type and the transistors within the second device region may be of a second dopant type. Generally, n-active region 103 and active region 105 may be associated with transistor(s) that are associated with physically and/or electrically distinct or separated gates. For example, as shown in FIG. 9, transistors within n-active region 103 have n-type gate 121 and transistors within active region 105 have p-type gate 123 that is physically and electrically distinct, isolated, and/or separated from n-type gate 121 by gate cut trench 190 within gate cut region 138.

Non-limiting examples of suitable materials for the substrate 102 include Si (silicon), strained Si, SiC (silicon carbide), Ge (germanium), SiGe (silicon germanium), SiGe:C (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb). The substrate 102 can be a bulk substrate. Alternatively, the substrate 102 may be one layer or a top layer of a multi-layered substrate. For example, substrate 102 may be a top layer of a substrate on insulator (e.g., silicon on insulator (SOI), or the like) that may include a lower substrate 106, such as a Si substrate, an insulator 104, such as a SiO insulator, upon the lower substrate 104, and the top substrate 102 upon the insulator 106.

When Si-containing substrate 102 is employed, it may have different surface crystallographic orientations. Common substrate 102 surface orientations are {100}, {110}, and {111}, while {100} crystallographic orientation is more typical due to its inherent crystallographic symmetry with respect to its response to asymmetric surface stressors imparted by useful surface structures. Furthermore, useful structures that are built on the substrate surface may be aligned to a particular crystallographic direction that is chosen based on substrate crystallography. Such reference crystallographic direction for a substrate 102 is often made visible to the substrate alignment equipment by placing a physical notch, flat, or other marker at the substrate perimeter. Typical crystallographic direction between such marker and the substrate center is <110> for Si-containing substrate 102 with {100} surface orientation. If the reference crystallographic direction to the substrate notch or other marker is different from <110> the substrate can be referred to as rotated.

In one embodiment, utilizing patterning, lithography, etching, etc. techniques, undesired portions of the substrate 102 may be removed while desired portions thereof may be retained and may form fins 110 and fins 114. Fins 110 and fins 114 can be patterned by conventional patterning techniques, such as Self-Aligned Double Patterning (SADP), Self-Aligned Quadruple Patterning (SAQP), etc. As fins 110 and fins 114 may be formed from subtracting material(s) from substrate 102, fins 110 and fins 114 may retain the material properties (e.g., dopants, or the like) therefrom.

In another embodiment, utilizing deposition techniques, fins 110 and fins 114 may be formed upon substrate 102. Fins 110 and fins 114 could be positively formed upon substrate 102 by deposition techniques such PVD, CVD, ALD, Epitaxial growth, or the like. In this embodiment, fins 110 and fins 114 may be doped, to form the appropriate dopant type of the transistor in the n-active region 103 and the appropriate dopant type of the transistor in the active region 105.

In one embodiment, the fins 110 and fins 114 have crystalline sidewalls that are {110} crystallographic planes. These planes may provide increased hole mobility and are therefore preferred. This can be accomplished by selecting a {100} surface substrate and aligning fins perpendicular to <110> direction. For a normal, nonrotated {100} substrate 102, aligning fins perpendicular to notch-center line produces {110} fin sidewalls and sets <110> crystallographic direction along the fins 110, 114.

STI region(s), an STI layer, or the like, which may be collectively referred herein as STI 112, may be formed by depositing STI material(s), such as silicon nitride (SiN), Silicon Dioxide (SiO$_2$), a combination of SiN and Silicon Dioxide (SiO$_2$) by different deposition method, upon the substrate 102, upon and between fins 110, and upon and between fins 114. STI 112 may be formed, as depicted in FIG. 13 as block 408, by depositing the STI material(s) by for example, PVD, CVD, ALD, or the like. STI 122 may, at least partially, electrically isolate neighboring transistor components or features. For example, STI 112 may at least partially physically and electrically isolate one fin 110 from a neighboring fin 110, may physically and electrically isolate fins 110 from fins 114, or the like.

Figure 3:
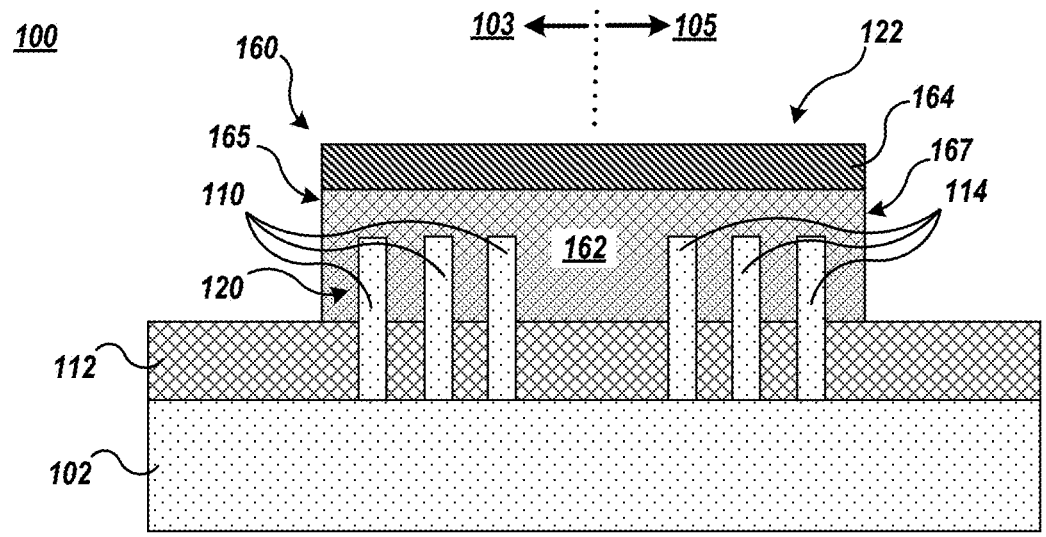

FIG. 3 depicts a cross-sectional view of semiconductor structure 100 shown after fabrication operations, in accordance with one or more embodiments. After these fabrication operations, depicted in FIG. 13 as block 410, and/or the like, semiconductor device 100 may further include one or more sacrificial gate structures 160. The one or more sacrificial gate structures 160 may be formed upon and around the one or more fins 110, 114 and upon STI regions 112. Sacrificial gate structure 160 may include a gate liner (not shown), a sacrificial gate 162, and a sacrificial gate cap 164.

The sacrificial gate structure 160 may be formed by initially forming a gate liner layer (e.g., a dielectric, oxide, or the like) upon substrate STI regions 112 and upon and around fins 110, 114. For instance, the gate liner layer may be deposited upon the upper surface of STI regions 112, sidewalls of fins 110, 114. The sacrificial gate structure 160 may further be formed by subsequently forming a sacrificial gate layer (e.g., a dielectric, amorphous silicon, or the like) upon the gate liner. The thickness of the sacrificial gate layer may be greater than the height of the one or more fins 110, 114.

The sacrificial gate structure 160 may further be formed by subsequently forming a gate cap layer upon the sacrificial gate layer. The gate cap layer may be formed by depositing a mask material, such as a hard mask material. The gate cap layer may be composed of one or more layers masking materials to protect the sacrificial gate layer and/or other underlying materials during subsequent processing of device 100. The gate cap layer can be formed of gate mask materials such as silicon nitride, silicon oxide, combinations thereof, or the like.

The gate cap layer, sacrificial gate layer, and gate liner may be patterned using conventional lithography and etch process to remove undesired portions and retain desired portion(s), respectively. The retained desired portion(s) of the gate cap layer, sacrificial gate layer, and gate liner may form the gate liner, the sacrificial gate 162, and the sacrificial gate cap 164, respectively, of each of the one or more sacrificial gate structures 160.

Each sacrificial gate structure 160 can be formed on targeted regions or areas of semiconductor device 100 to define the length of one or more transistors, and to provide sacrificial material for yielding targeted transistor structure(s) in subsequent processing. According to an example, each sacrificial gate structure 160 can have a height of between approximately 50 nm and approximately 200 nm, and a length of between approximately 15 nm and approximately 200 nm.

Multiple sacrificial gate structures 160 may be arranged in an in-out of the page perspective, with respect to the exemplary cross section of FIG. 3. For example, a sacrificial gate structure 160 may define the location of inline n-type gate 121 and p-type gate 123 combination, may define the location of each auxiliary gate 151.

In some embodiments, after the fabrication of the sacrificial gate structure(s) 160, a gate spacer (not shown) may be formed upon side surface 120 and an opposing gate spacer (not shown) may be formed upon the opposing side surface 122 of the sacrificial gate structure(s) 160, and as depicted in FIG. 13 as block 412, and/or the like. The gate spacer(s) may further be formed upon end surface 165, 167 of the associated sacrificial gate structure(s) 160. In these embodiments, each sacrificial gate structure 160 may further include the gate spacer(s) formed upon the applicable side and/or end surface(s).

Figure 4:
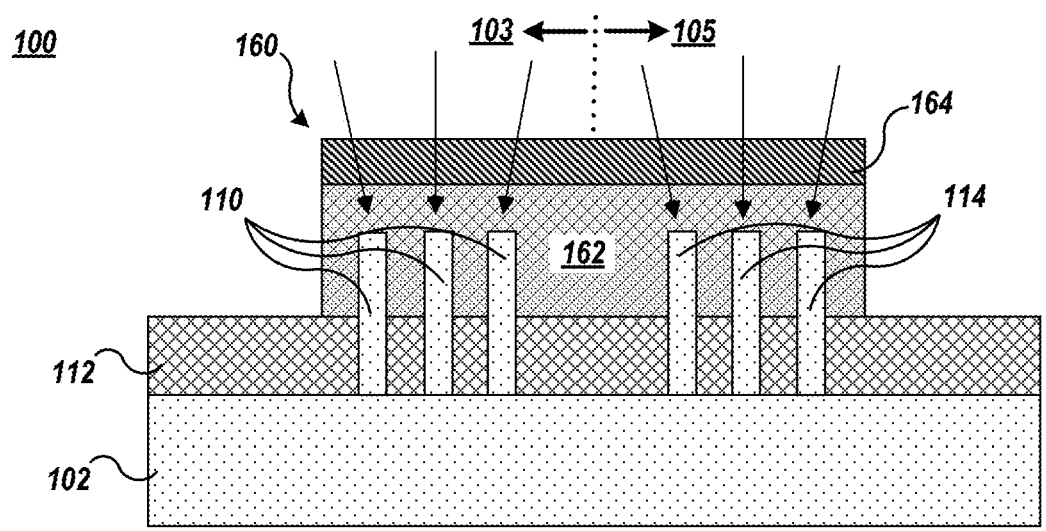

FIG. 4 depicts a cross-sectional view of semiconductor structure 100 shown after fabrication operations, in accordance with one or more embodiments. After these fabrication operations, depicted in FIG. 13 as block 414, and/or the like, semiconductor device 100 may further include source/drain regions formed by dopped fins 110, 114 that extend outward from the side surface 120 and/or the side surface 122 of the associated sacrificial gate structure(s) 160.

In the embodiment depicted, fins 110 and fins 114 may be dopped to form the appropriate dopant type of the transistor in the n-active region 103 and the appropriate dopant type of the transistor in the active region 105 to form source/drain regions. In alternative embodiments, fins 110, 114 may be formed from substrate 102 that was earlier subjected to doping processes, such that the formed fins 110, 114 have the appropriate dopants, to form the appropriate source and drain of the transistor in the n-active region 103 and the appropriate source and drain of the transistor in the active region 105.

Figure 5:
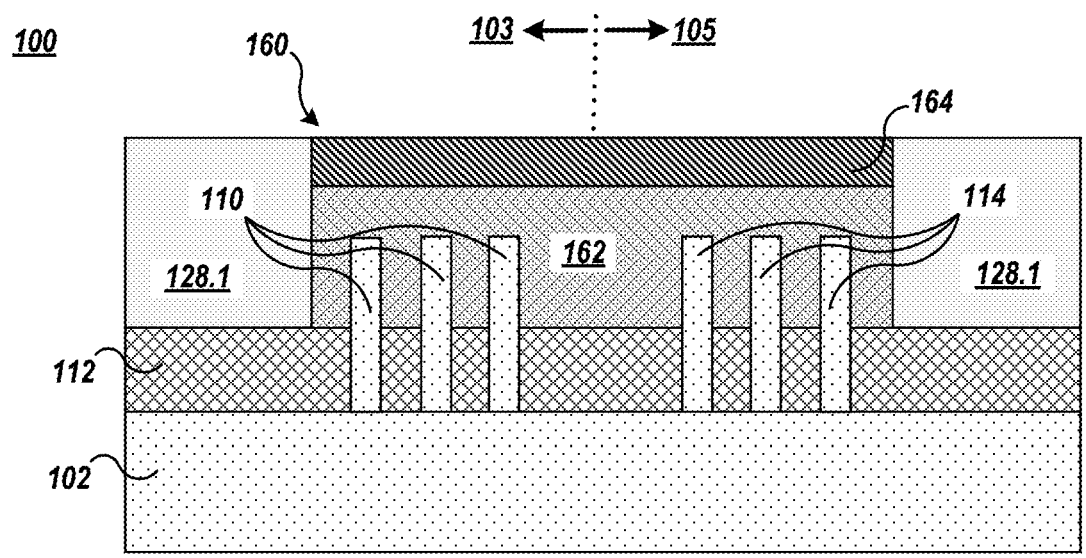

FIG. 5 depicts a cross-sectional view of semiconductor structure 100 shown after fabrication operations, in accordance with one or more embodiments. After these fabrication operations, depicted in FIG. 13 as block 416, and/or the like, semiconductor device 100 may further include ILD 128.1.

ILD 128.1 may be formed by depositing a dielectric material with a deposition method, such as atomic layer deposition (ALD) or CVD, over STI 112, over sacrificial gate structure(s) 160, and over fins 110, 114. In some implementations, a chemical mechanical polish (CMP) of ILD 128.1 may occur to planarize the top surface of ILD 128.1 with the top surface of the one or more sacrificial gate structure(s) 160.

Figure 6:
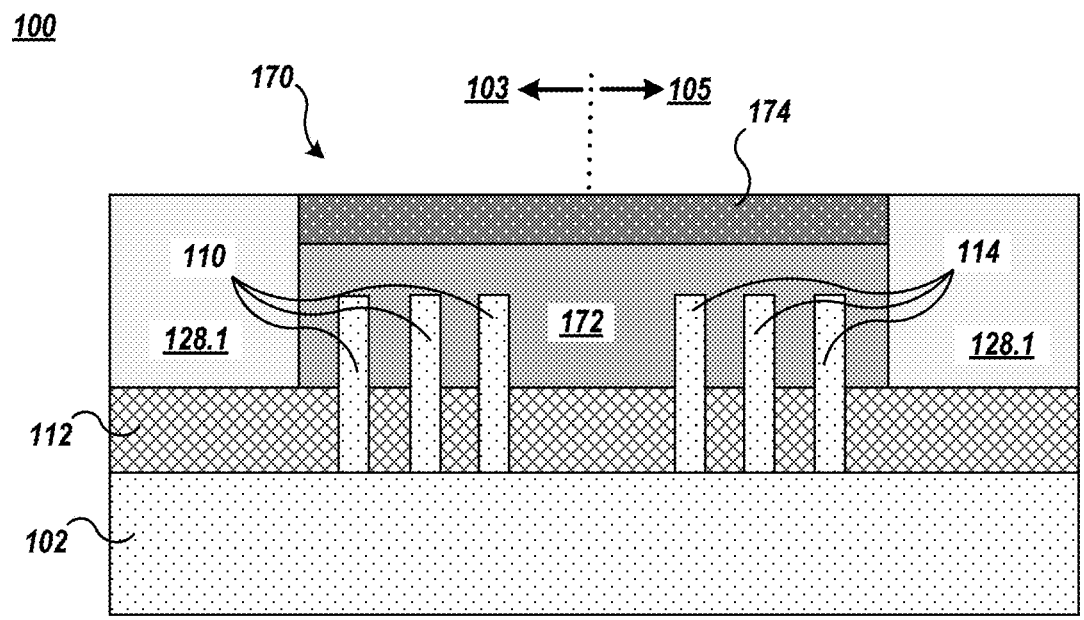

FIG. 6 depicts a cross-sectional view of semiconductor structure 100 shown after fabrication operations, in accordance with one or more embodiments. After these fabrication operations, depicted in FIG. 13 as block 418, and/or the like, semiconductor device 100 may further include a replacement gate structure 170 formed in place of one or more removed sacrificial gate structures 160.

Replacement gate structure 170 within the n-active region 103 and within active region 105 may be formed by initially removing the sacrificial gate 162 and gate mask 164, retaining the gate liner associated therewith, forming a gate conductor 172 upon the retained gate liner, and forming a gate cap 174 upon the gate conductor 172.

In some embodiments, the gate liner is further removed, and a replacement gate dielectric may be formed upon the STI region 112 and upon and around fins 110, 114. The replacement gate dielectric can comprise any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, magnesium. The replacement gate dielectric material can be formed by any suitable deposition process or the like. In some embodiments, the replacement gate dielectric material has a thickness ranging from 1 nm to 5 nm, although less thickness and greater thickness are also conceived.

Gate conductor 172 may be formed of any suitable conductive material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO2), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material may further comprise dopants that are incorporated during or after deposition.

In some embodiments, the replacement gate structure 170 may further include a work function setting layer between the gate conductor 172 and gate liner or replacement gate dielectric, respectively. The work function setting layer can be a work function metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor 172 and the WFM.

Gate conductor 172 and the WFM (if present) can be formed by any suitable process or any suitable combination of multiple processes, including but not limited to, ALD, CVD, PVD, sputtering, plating, evaporation, ion beam deposition, electron beam deposition, laser assisted deposition, chemical solution deposition, etc.

Subsequently, a gate cap 174 may be formed upon the gate conductor 172. The gate cap 174 may be a hard mask, or the like. Exemplary gate cap 174 materials may be SiN, SiO$_2$, a combination of SiN and SiO$_2$, SiON, SICN, SIOCN, or the like. The gate cap 174 may be formed by deposition techniques such PVD, CVD, ALD, or the like. The gate cap 174 material can have a thickness of from about 1 nm to about 200 nm, although other thicknesses are within the contemplated scope.

After formation of replacement gate structures, excessive gate cap 174 materials can be removed by an etching or polish process. Removal of the excess gate cap 174 materials can be accomplished using, for example, a CMP, selective wet etch process, or a selective dry etch process, or other subtractive removal technique. As such, the top surface of gate cap 174, the gate spacers, and ILD 128.1 may be coplanar.

For clarity, appropriate respective replacement gate structures 170 may effectively form each auxiliary gate 150, as depicted in FIG. 1A.

Figure 7:
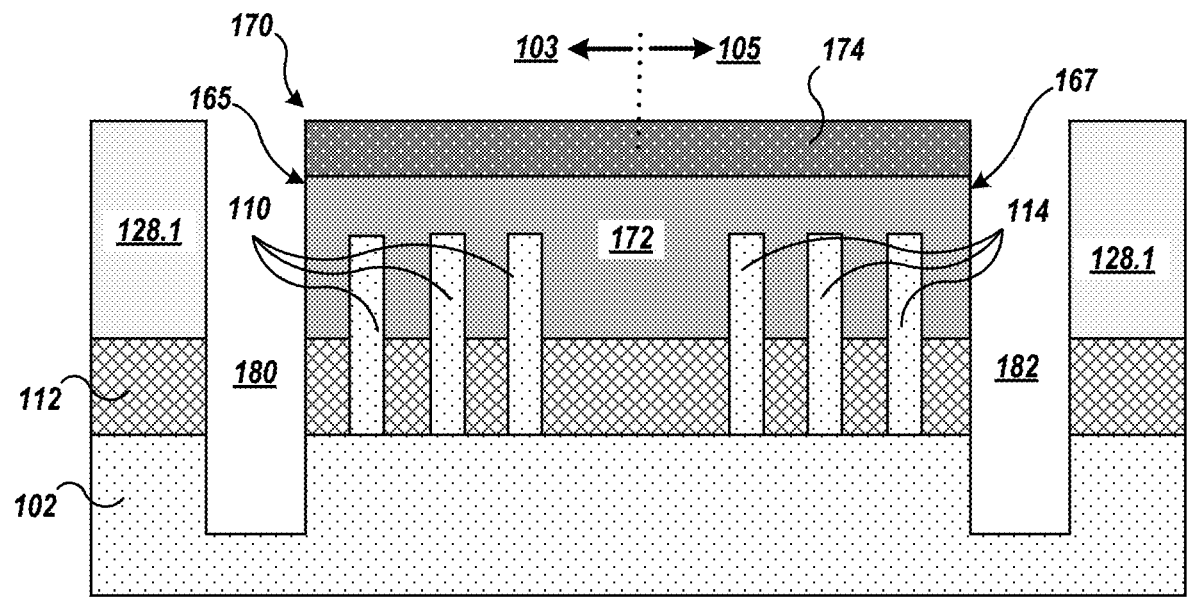

FIG. 7 depicts a cross-sectional view of semiconductor structure 100 shown after fabrication operations, in accordance with one or more embodiments. After these fabrication operations, depicted in FIG. 13 as block 420, and/or the like, semiconductor device 100 may further include gate cut trench 180 within n-active region 103 and gate cut trench 182 within active region 105.

Gate cut trenches 180, 182 may be formed by first removing portions of ILD 128.1 and STI region 112 stopping at the top surface of substrate 102. In this implementation, an undesired portion of ILD 128.1 and/or gate spacer (if present) and STI 112 may be removed to expose the end surfaces 165, 167 of replacement gate structure(s) 170, respectively. The undesired portions of these applicable material(s) may be removed removal techniques such as e.g., depositing and patterning a gate cut mask, lithography, etching, or the like.

Gate cut trenches 180, 182 may be further formed by subsequently removing portions of substrate 102, such that gate cut trenches 180, 182, are formed to the depth, d. Generally, gate cut trenches 180, 182, are formed to the depth, d, such that the lower or bottom well surface of gate cut trenches 180, 182, are below the top surface of the substrate 102. In this implementation, the undesired portion of substrate 102 may be removed to form the relatively deeper gate cut trench, as described above. The undesired portions of substrate 102 may be removed removal techniques such as further etching away the portions of substrate 102 that were exposed previously by the initial gate cut trench 180, 182 formations, or the like.

Figure 8:
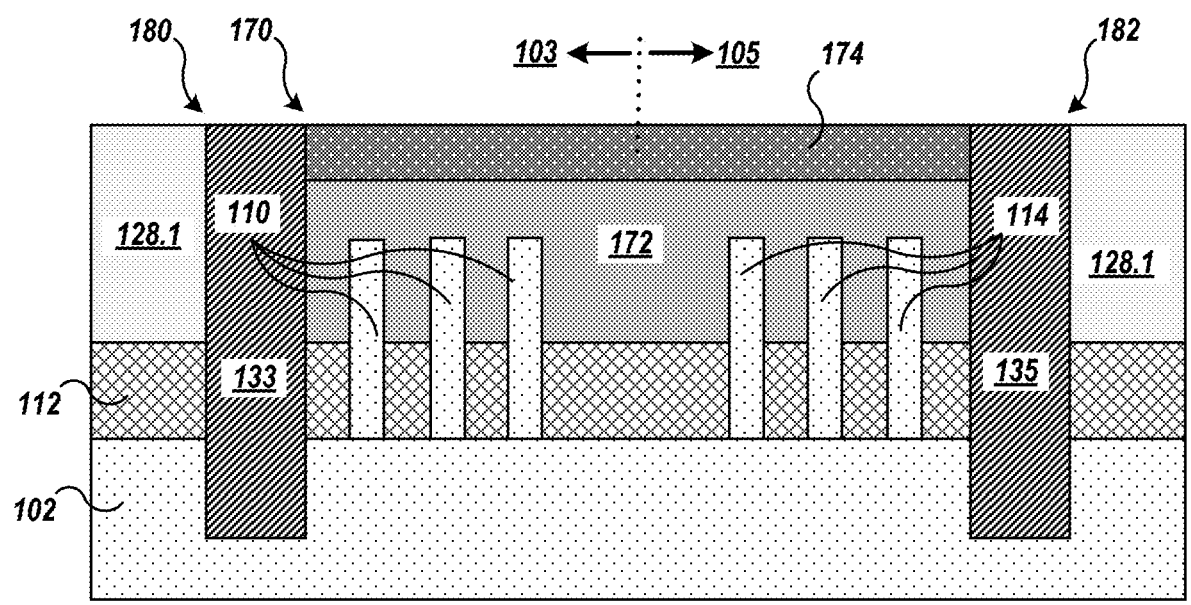

FIG. 8 depicts a cross-sectional view of semiconductor structure 100 shown after fabrication operations, in accordance with one or more embodiments. After these fabrication operations, depicted in FIG. 13 as block 422, and/or the like, semiconductor device 100 may further include gate cut region 133 formed within gate cut trench 180 within n-active region 103 and gate cut region 135 formed within gate cut trench 180 with active region 105.

As depicted, gate cut regions 133, 135 may contact and separate replacement gate structure 170 and ILD 128.1. However, in other implementations, gate cut regions 133, 135 may contact and separate two or more neighboring inline replacement gate structures 170 from one another, respectively.

Gate cut regions 133, 135 may be formed by depositing a dielectric material upon substrate 102 and upon the inner facing sidewalls of gate cut trenches 180, 182, thereby filling the gate cut trenches 180, 182. For example, the gate cut regions 133, 135 can be formed by any suitable techniques such as deposition (ALD, CVD, etc.).

Gate cut regions 133, 135 can have a width from about 30 nm to about 200 nm. In some embodiments, gate cut regions 133, 135 can have a width from about 5 nm to about 50 nm, although other widths are within the contemplated scope of the invention. Exemplary gate cut regions 133, 135 materials may be but are not limited to: silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), silicon oxide, a metal upon a liner as an insulator, combinations thereof, etc. The gate cut regions 133, 135 can be a low-k material having a dielectric constant less than about 7, less than about 5, or the like.

After formation of gate cut region 133, 135, excessive gate cut regions 133, 135 material(s) can be removed by an etching or polish process, such as a CMP. Removal of the excess gate cut regions 133, 135 material(s) can be accomplished using, for example, a selective wet etch process, or a selective dry etch process, or other subtractive removal technique. As such, the top surface of gate cap 174, the gate spacers, ILD 128.1, and gate cut regions 133, 135 may be coplanar.

FIG. 9 depicts a cross-sectional view of semiconductor structure 100 shown after fabrication operations, in accordance with one or more embodiments. After these fabrication operations, depicted in FIG. 13 as block 424, and/or the like, semiconductor device 100 may further include gate cut trench 190 within gate cut region 138 that physically separates gate cap 174 and gate conductor 172, of applicable replacement gate structures 170, effectively forming n-type gate 121 and gate cap 124 within n-active region 103 and forming p-type gate 123 and gate cap 124 within active region 105.

Gate cut trench 190 may be formed by first removing portion(s) of gate cap 174, gate conductor 172, gate spacers (if present), ILD 128.1 (if necessary), and STI region 112 within gate cut region 138 stopping at the top surface of substrate 102. In this implementation, an undesired portion of gate cap 174, gate conductor 172, ILD 128.1 and/or gate spacer (if present) and STI 112 may be removed to create end surfaces 191, 193 of replacement gate structure(s) 170, respectively, effectively forming n-type gate 121 and gate cap 124 within n-active region 103 and forming p-type gate 123 and gate cap 124 within active region 105. The undesired portions of these applicable material(s) may be removed removal techniques such as e.g., depositing and patterning a gate cut mask, lithography, etching, or the like.

Gate cut trench 190 may be further formed by subsequently removing portions of substrate 102, such that gate cut trench 190 is formed to the depth, d. Generally, gate cut trench 190 are formed to the depth, d, such that the lower or bottom well surface of gate cut trench 190 is below the top surface of the substrate 102. In this implementation, the undesired portion of substrate 102 may be removed to form the relatively deeper gate cut trench, as described above. The undesired portions of substrate 102 may be removed removal techniques such as further etching away the portions of substrate 102 that was exposed previously by the initial gate cut trench 190 formation, or the like.

For clarity, n-type gate 121 and p-type gate 123 may be formed from gate cap 174 and gate conductor 172 of the same replacement gate structures 170. Therefore, n-type gate 121 and p-type gate 123 may be inline gates, such that their respective side surfaces 120, 122 are coplanar.

Figure 10:
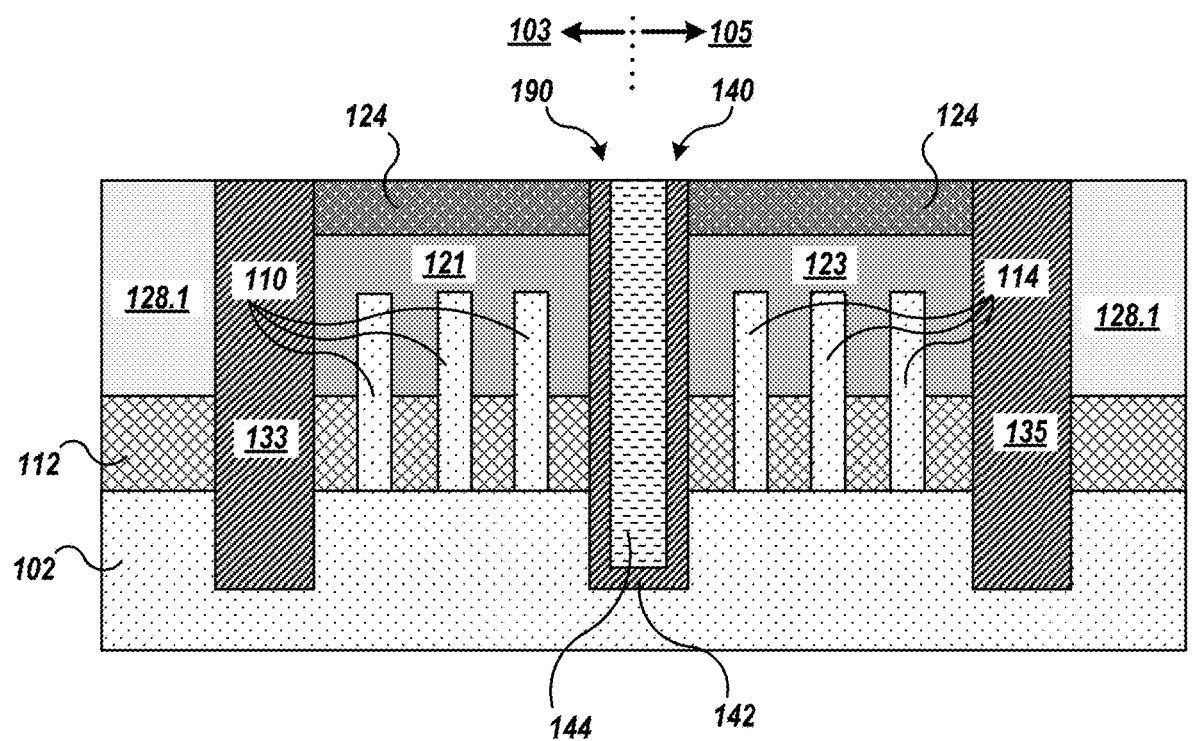

FIG. 10 depicts a cross-sectional view of semiconductor structure 100 shown after fabrication operations, in accordance with one or more embodiments. After these fabrication operations, depicted in FIG. 13 as block 426, and/or the like, semiconductor device 100 may further include decoupling capacitor 140 formed within gate cut trench 190.

Depicted in FIG. 13 as block 428, and/or the like, decoupling capacitor 140 may be formed by initially depositing dielectric layer 142 within the inner facing side surfaces and bottom well surface of gate cut trench 190 with a deposition method, such as ALD, CVD, or the like. The dielectric layer 142 dielectric can comprise any suitable dielectric material, including but not limited to silicon oxide, silicon nitride, silicon oxynitride, high-k materials, or any combination of these materials. In some embodiments, dielectric layer 142 has a thickness ranging from 1 nm to 5 nm, although less thickness and greater thickness are also conceived.

Depicted in FIG. 13 as block 430, and/or the like, decoupling capacitor 140 may be formed by subsequently depositing ferroelectric layer 144 material upon the dielectric layer 142 within the remaining gate cut trench 190 utilizing a deposition method, such as ALD, CVD, or the like. In various embodiments, ferroelectric layer 144 may be a hafnium zirconium oxide (HZO) layer. In other embodiments, ferroelectric layer 144 may be formed of one of lead zirconium titanate (PZT), silicon-doped hafnium oxide (Si: HfO2), or barium titanite. However, ferroelectric layer 144 is not limited to these materials and may another suitable ferroelectric material.

In one implementation, dielectric layer 142 is formed as a blanket layer upon ILD 128.1, upon gate cut region 133, upon gate cap 124, upon gate cap 126, upon gate cut region 135, and upon the inner facing side surfaces and bottom well surface of gate cut trench 190. In other words, a liner dielectric layer 142 may be formed upon exposed top and gate cut trench 190 surfaces of semiconductor structure 100. Subsequently, ferroelectric layer 144 material is deposited upon the blanket dielectric layer 142 to a thickness such that the remaining gate cut trench 190 is filled with ferroelectric layer 144. A substrative removal technique, such as an etch, CMP, or the like may remove excess blanket dielectric layer 142 material and ferroelectric layer 144 material while retaining the dielectric layer 142 and ferroelectric layer 144 material within gate cut trench 190.

For clarity, as ferroelectric layer 144 may be formed upon the dielectric layer 142, such that the remaining gate cut trench 190 is filled with ferroelectric layer 144, it is to be understood that dielectric layer 142 may be a perimeter liner that lines the perimeter sides and permitter bottom of the decoupling capacitor 140 and that ferroelectric layer 144 may be an inner fill that is internal to the perimeter dielectric layer 142 liner and that may generally fill the remaining gate cut trench 190.

Figure 11:
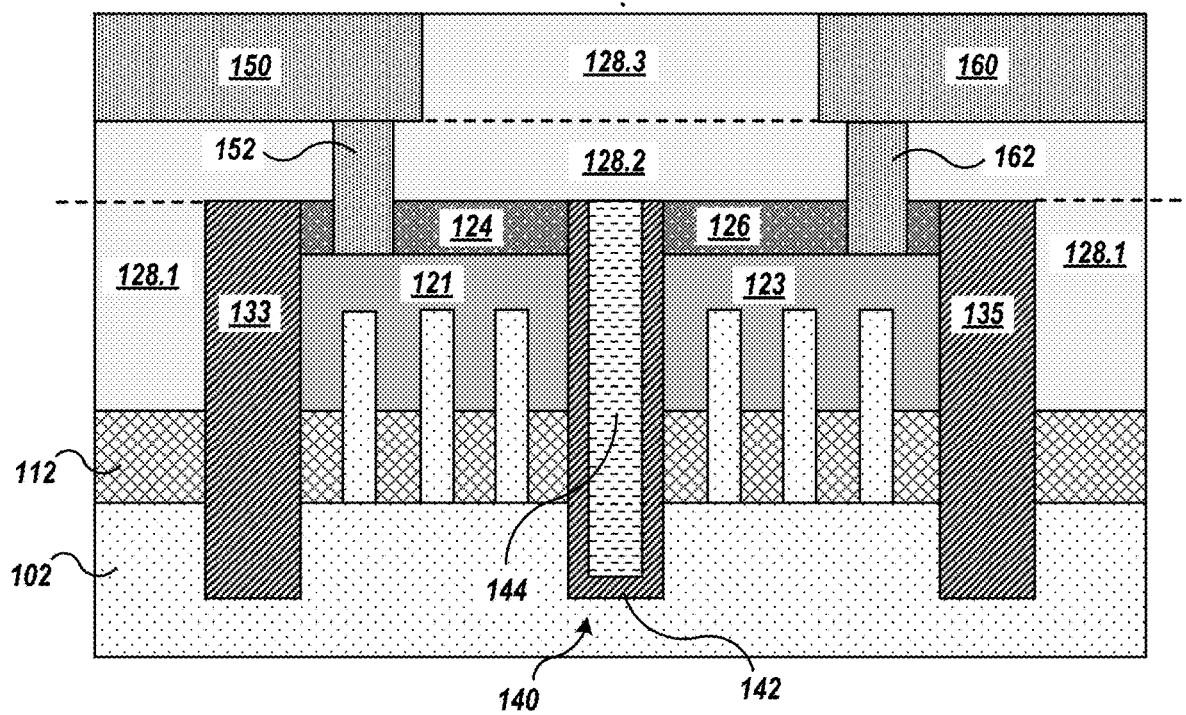

FIG. 11 depicts a cross-sectional view of semiconductor structure 100 shown after fabrication operations, in accordance with one or more embodiments. After these fabrication operations, depicted in FIG. 13 as block 432, and/or the like, semiconductor device 100 may further include middle of the line (MOL) wiring and/or back end of the like (BEOL) wiring features, such as ILD 128.2, 128.3, or the like, via contact 152, via contact 162, power rail 150, and/or power rail 160.

Using via 152, via 162 formation processes, a layer of ILD 128.2 may be deposited upon the ILD 128.1, upon the gate cut regions 133, 135, upon gate caps 124, 126, and upon the decoupling capacitor 140. Using photolithography and conventional etch processes, such as RIE, a wet chemical etch, or other etching processes, a selective etch of ILD 128.2 and/or of gate caps 124, 126 removes portions of ILD 128.2 and portions of gate caps 124, 126 that exist over n-type gate 121, and over p-type gate 123, respectively. A conductive material deposition may occur to fill the areas or via holes formed by the removal of the ILD 128.2 and/or gate caps 124, 126 to form via contact 152 and via contact 162. As such, the conductive material of via contacts 152, 162 may contact or electrically contact n-type gate 121 and p-type gate 123, respectively. A CMP may remove excess conductive material from the top surface of ILD 128.2 to planarize the top surface of ILD 128.2 with the top surface of via contact 152 and with the top surface of via contact 162. Utilizing the same or similar MOL processes, simultaneously or not simultaneously, source/drain fin 110, 114 contact(s) may also be formed.

Power rails 150 and 160 can be formed on via 152, 162, respectively. For example, another deposition of ILD 128.3 over the top of via contacts 152, 162 and ILD 128.2 may occur. Using photolithography and conventional etch processes, such as RIE, a wet chemical etch, or other etching processes, a selective etch of ILD 128.3 removes portions of ILD 128.3 that exist over via contacts 152, 162 and that exist over gate cut regions 133, 135, respectively. A conductive material deposition may occur to fill the areas or trenches formed by the removal of the ILD 128.3 to form power rails 150, 160. As such, the conductive material of power rails 150, 160 may contact or electrically contact via contacts 152, 162, respectively. A CMP may remove excess conductive material from the top surface of ILD 128.3 to planarize the top surface of ILD 128.3 with the top surface of power rails 150, 160. Utilizing the same or similar BEOL processes, simultaneously or not simultaneously, source/drain wiring lines may be formed upon the source/drain fin 110, 114 contact(s). Variations, or a different order of the some of the steps of the method related to FIGS. 2-11 can be done (e.g., differences in when materials are deposited, differences in when materials are removed, etc.) to achieve the semiconductor structure 100 depicted in FIG. 11.

FIG. 12 depicts a cross-sectional view of semiconductor structure 300 shown after fabrication operations, in accordance with one or more embodiments. After these fabrication operations, semiconductor device 300 may further include nanostructure(s) type transistor 302 in n-active region 103 and nanostructure type transistor 304 in active region 103.

In the present embodiment, the n-type gate 121 and the p-type gate 123 may be wrap around gates that contact all sides of each channel of the nanostructure type transistors 302, 304 respectively. Portions of the nanostructure may extend (e.g., into and/or out of the page) from the n-type gate 121 and the p-type gate 123 and serve as the source/drain and/or connect to a source/drain, respectively, of the nanostructure type transistor. Portions of the nanostructure covered by the wraparound n-type gate 121 and p-type gate 123 serve as the channel, respectively, of the nanostructure type transistor 302, 304, respectively.

FIG. 13 depicts method 400 of fabricating semiconductor structure 100. The fabrication operations of method 400 are illustrated by the depicted blocks and are further described above.

FIG. 14 depicts method 500 of fabricating semiconductor structure 300. The fabrication operations of method 500 are depicted by the depicted blocks and are further described above.

In some embodiments, method 500 may include forming, choosing, providing, or the like, substrate 102 with a preferred or predetermined crystallographic orientation(s) and structures, forming alternating layers of sacrificial nanosheets and channel nanosheets, and forming a mask layer upon a top sacrificial nanosheet layer. The sacrificial nanosheet layers, channel nanosheet layers, and mask layer may be patterned into long nano layer structures (block 504).

At block 506, sacrificial gate structure(s) 160 may be formed upon the substrate 102 and upon and around the long nano layer structures and gate spacers are formed upon the side surfaces of the sacrificial gate structure (block 508). Next, at block 510, the long nano layer structures may be patterned between adjacent sacrificial gate structure(s) 160 to create nanostructure stacks that comprise alternating layers of sacrificial nano layers or nanosheets and channel layers or channel nanosheets.

At block 512 the sacrificial nanosheets outside of the sacrificial gate structure(s) 160 may be indented and an inner spacer may be formed within the indents. Next, at block 514 source/drain regions are formed such that the end surfaces the channel nanosheets of the nanostructure stacks contact a source and that distal end surfaces of the channel nanosheet of the nanostructure stacks contact a drain.

At block 516, the sacrificial nanosheets under the sacrificial gate structure(s) 160 are removed. Next, at block 518, the sacrificial gate structure(s) 160 are removed and replaced with replacement gate structure 170 that wrap around the channel nanosheets.

At block 520, gate cut trench 180 is formed within n-active region 103 and gate cut gate cut trench 182 is formed within active region 105. Next, at block 522 gate cut region 133 is formed within gate cut trench 180 and gate cut region 135 is formed within gate cut trench 182.

At block 524, gate cut trench 190 is formed separating replacement gate structure 170 into n-type gate 121 and p-type gate 123. Next, decoupling capacitor 140 is formed within gate cut trench 190 (block 526). The decoupling capacitor 140 may be formed by initially depositing dielectric layer 142 within the inner facing side surfaces and bottom well surface of gate cut trench 190 (block 528) and depositing ferroelectric layer 144 material upon the dielectric layer 142 within the remaining gate cut trench 190 (block 530). Finally, at block 532, wiring features such as ILD 128.2, via contacts 152, 162, power rails 150, 160 may be formed in MOL and/or BEOL processing.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, the semiconductor structure comprising:
    a first power rail and a second power rail;
    a first via contact that connects the first power rail to a first portion of a decoupling capacitor through a first gate that is within a n-active region; and
    a second via contact that connects the second power rail to a second portion of the decoupling capacitor though a second gate that is within a p-active region,
    where the decoupling capacitor comprises a ferroelectric material fill and separates the first gate from the second gate.

2. The semiconductor structure of claim 1, wherein the decoupling capacitor comprises a dielectric perimeter liner.

3. The semiconductor structure of claim 2, wherein the ferroelectric material fill is over the dielectric perimeter liner.

4. The semiconductor structure of claim 3, wherein a first end of the first gate physically contacts the dielectric perimeter liner of the decoupling capacitor and a first end of the second gate physically contacts the dielectric perimeter liner of the decoupling capacitor.

5. The semiconductor structure of claim 4, further comprising:
a first gate cut dielectric region and a second gate cut dielectric region.

6. The semiconductor structure of claim 5, wherein the first gate cut dielectric region is below the first power rail and wherein the second gate cut dielectric region is below the second power rail.

7. The semiconductor structure of claim 5, wherein a second end of the first gate physically contacts the first gate cut dielectric region and wherein a second end of the second gate physically contacts the second gate cut dielectric region.

8. The semiconductor structure of claim 7, wherein a top surface of the decoupling capacitor is coplanar with a top surface of the first gate cut dielectric region and is coplanar with a top surface of the second gate cut dielectric region.

9. The semiconductor structure of claim 7, wherein a bottom surface of the decoupling capacitor is coplanar with a bottom surface of the first gate cut dielectric region and is coplanar with a bottom surface of the second gate cut dielectric region.

10. The semiconductor structure of claim 7, further comprising:
first fins upon a substrate and wherein the first gate is upon and around the first fins; and
second fins upon the substrate and wherein the second gate is upon and around the second fins.

11. The semiconductor structure of claim 10, wherein the decoupling capacitor extends into the semiconductor structure to a plane that is below a top surface of the substrate.

12. The semiconductor structure of claim 11, wherein the first gate and the second gate are inset relative to the decoupling capacitor.

13. A semiconductor structure, the semiconductor structure comprising:
a power rail;
a via contact that connects the power rail to a portion of a decoupling capacitor through a first gate; and
a second gate,
where the decoupling capacitor comprises a ferroelectric material fill and separates the first gate from the second gate.

14. The semiconductor structure of claim 13, wherein the decoupling capacitor comprises a dielectric perimeter liner.

15. The semiconductor structure of claim 14, wherein the ferroelectric material fill is over the dielectric perimeter liner.

16. The semiconductor structure of claim 15, wherein a first end of the first gate physically contacts the dielectric perimeter liner of the decoupling capacitor and a first end of the second gate physically contacts the dielectric perimeter liner of the decoupling capacitor.

17. The semiconductor structure of claim 16, further comprising a gate cut dielectric region under the power rail.

18. The semiconductor structure of claim 17, wherein a second end of the first gate physically contacts the gate cut dielectric region.

19. The semiconductor structure of claim 18, wherein a top surface of the decoupling capacitor is coplanar with a top surface of the gate cut dielectric region.

* * * * *